United States Patent
Kim et al.

(10) Patent No.: US 9,735,288 B2
(45) Date of Patent: Aug. 15, 2017

(54) ONE TIME PROGRAMMABLE NON-VOLATILE MEMORY DEVICE

(71) Applicant: Magnachip Semiconductor, Ltd., Cheongju-si (KR)

(72) Inventors: Tae Ho Kim, Cheongju-si (KR); Kyung Ho Lee, Cheongju-si (KR); Young Chul Seo, Gwangmyeong-si (KR); Sung Jin Choi, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/204,394

(22) Filed: Jul. 7, 2016

(65) Prior Publication Data
US 2017/0179297 A1    Jun. 22, 2017

(30) Foreign Application Priority Data

Dec. 18, 2015  (KR) .................. 10-2015-0182227

(51) Int. Cl.
- *H01L 29/78*   (2006.01)
- *H01L 29/788*  (2006.01)
- *H01L 29/423*  (2006.01)
- *H01L 29/66*   (2006.01)

(52) U.S. Cl.
CPC .... *H01L 29/7885* (2013.01); *H01L 29/42328* (2013.01); *H01L 29/66825* (2013.01); *H01L 29/7833* (2013.01)

(58) Field of Classification Search
CPC .......... H01L 29/7885; H01L 29/66825; H01L 29/7833; H01L 29/42328
See application file for complete search history.

(56) References Cited

U.S. PATENT DOCUMENTS

| | | | |
|---|---|---|---|
| 5,877,524 A | 3/1999 | Oonakado et al. | |
| 6,172,397 B1 | 1/2001 | Oonakado et al. | |
| 6,465,837 B1* | 10/2002 | Wu | H01L 21/28273 257/314 |

(Continued)

FOREIGN PATENT DOCUMENTS

| | | |
|---|---|---|
| EP | 2854136 A1 | 4/2015 |
| JP | 2005-197750 A | 7/2005 |

(Continued)

OTHER PUBLICATIONS

Korean Office Action dated May 25, 2017 in corresponding Korean Patent Application No. 10-2015-0182227 (5 pages in Korean).

*Primary Examiner* — Roy Potter
*Assistant Examiner* — Paul Patton
(74) *Attorney, Agent, or Firm* — NSIP Law

(57) ABSTRACT

A one-time programmable non-volatile memory device includes a first conductivity type well region located in a semiconductor substrate, a selection gate electrode and a floating gate electrode located on the substrate, a first doped region located between the selection gate electrode and the floating gate electrode, a second conductivity type source region located on one side of the selection gate electrode, and a second conductivity type drain region located on one side of the floating gate electrode, wherein a depth of the drain region has a depth shallower than that of the first doped region with respect to a top surface of the substrate.

18 Claims, 10 Drawing Sheets

(56) References Cited

U.S. PATENT DOCUMENTS

| | | | |
|---|---|---|---|
| 6,740,556 B1 | 5/2004 | Hsu et al. | |
| 6,819,594 B2 | 11/2004 | Lee et al. | |
| 6,914,825 B2 | 7/2005 | Hsu et al. | |
| 6,920,067 B2 * | 7/2005 | Hsu | G11C 16/0408 |
| | | | 257/E27.103 |
| 7,078,761 B2 | 7/2006 | Wang et al. | |
| 7,250,654 B2 | 7/2007 | Chen et al. | |
| 7,262,457 B2 | 8/2007 | Hsu et al. | |
| 7,557,404 B2 | 7/2009 | Koh et al. | |
| 7,682,908 B2 | 3/2010 | Chen et al. | |
| 7,768,059 B2 | 8/2010 | Chen et al. | |
| 7,799,635 B2 | 9/2010 | Koh et al. | |
| 8,592,886 B2 | 11/2013 | Hsu et al. | |
| 2005/0145924 A1 | 7/2005 | Liu et al. | |
| 2007/0194369 A1 | 8/2007 | Koh et al. | |
| 2009/0239349 A1 | 9/2009 | Koh et al. | |
| 2010/0006924 A1 | 1/2010 | Chen et al. | |

FOREIGN PATENT DOCUMENTS

| | | |
|---|---|---|
| JP | 2015-070261 A | 4/2015 |
| KR | 10-0211187 B1 | 7/1999 |
| KR | 10-0742284 | 7/2007 |

* cited by examiner

Cross section Y-Y'

Cross section Y-Y'

Skip

Only HNM

ONE TIME PROGRAMMABLE NON-VOLATILE MEMORY DEVICE

CROSS-REFERENCE TO RELATED APPLICATIONS

This application claims the benefit under 35 USC 119(a) of Korean Patent Application No. 10-2015-0182227 filed on Dec. 18, 2015 in the Korean Intellectual Property Office, the entire disclosure of which is incorporated herein by reference for all purposes.

BACKGROUND

1. Field

The present disclosure relates to a one time programmable non-volatile memory, hereinafter, referred to as "OTP-NVM," semiconductor device. Such an OTP-NVM is a type of an electrically programmable read only memory, hereinafter, referred to as "EPROM." The present disclosure also relates to a semiconductor device with improved credibility and storage reliability through increasing generation of hot carrier injection, hereinafter, referred to as "HCl."

2. Description of Related Art

An EPROM which is used as an OTP-NVM cell is able to electrically store or remove data. Further, such an EPROM is advantageous in storing data without power. Thereby, recently such an EPROM is widely used as an embedded component in various logic devices. For example, an EPROM is a core device composing a micro controller unit, hereinafter, referred to as a "MCU." In such an example, the MCU controls all electric or electronic products such as home appliance, remote controller, or color TV, in a manner which is similar to the operation of a CPU controlling a computer.

When the hot carriers HC are generated near the drain region of a PMOS in the OTP-NVM cell, hot carriers are injected by hot carrier injection HCl into the OTP floating gate. When electrons are charged in the OTP floating gate, the OTP-NVM cell is read as "1" and when the electrons are discharged the OTP-NVM cell is read as "0." The more HC is effectively injected, the more the rapid electric field change that is generated near the drain region. In such an example, the state in which the electrons are charged is referred to as programming "PGM."

When using a logic device which is fabricated through a logic process, HC is less injected in such a process because a lightly doped drain, hereinafter, referred to as "LDD" region is formed in the drain region. This approach of having HC be less injected occurs because, due to the presence of the LDD region, a rapid electric field change is not formed in the drain region, but instead a mild electric field is formed.

When HC is lightly injected into the floating gate during the programming state, that is, when the amount of electrons injected into the floating gate is small, the read current decreases during a reading operation. Accordingly, there is a problem that the OTP-NVM cell is read as not programmed since the read current is detected as smaller than a reference current, and even though there is supposed to be programming, it is not detected.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples overcome the above disadvantages and other disadvantages not described above. However, the examples are not required to overcome the disadvantages described above, and an example potentially does not overcome any of the problems described above.

In one general aspect, a one-time programmable non-volatile memory device includes a first conductivity type well region located in a semiconductor substrate, a selection gate electrode and a floating gate electrode located on the substrate, a first doped region located between the selection gate electrode and the floating gate electrode, a second conductivity type source region located on one side of the selection gate electrode, and a second conductivity type drain region located on one side of the floating gate electrode, wherein a depth of the drain region has a shallower depth than that of the first doped region with respect to a top surface of the substrate.

The one-time programmable non-volatile memory device may further include a contact plug located on the source and drain regions, and the contact plug may not be located on the first doped region.

The first doped region may include a heavily doped region and a lightly doped region, and the drain region may include a lightly doped region that is blocked.

The one-time programmable non-volatile memory device may further include a third doped region located between the drain region and the well region, wherein the third doped region completely surrounds the drain region, and has an opposite conductivity type from the drain region.

The one-time programmable non-volatile memory device may further include a third doped region located between the drain region and the well region, wherein the third doped region has a shallower depth than that of the first doped region, and has a same conductivity type as the drain region.

The one-time programmable non-volatile memory device may further include a third doped region formed between the drain region and the well region, wherein the third doped region completely surrounds the drain region, and has a lower dopant concentration than the drain region.

The first doped region may overlap with the floating gate electrode and the selection gate electrode.

The one-time programmable non-volatile memory device may further include a contact plug located on the selection gate electrode, wherein the contact plug is not located on the floating gate electrode and the selection gate electrode and the floating gate electrode are doped with a dopant of the second conductivity type.

The contact plug may be a word line contact plug, a bit line contact plug, or a source line contact plug.

The source region may include a heavily doped region and a lightly doped region, and a depth of the source region may be deeper than a depth of the drain region.

The one-time programmable non-volatile memory device may further include a silicide layer located on the selection gate electrode, wherein a silicide blocking layer is not located on the floating gate electrode.

The silicide blocking layer may be a silicon oxide layer or a silicon nitride layer.

In another general aspect, a one-time programmable non-volatile memory device includes a semiconductor substrate including an active region and an isolation region, at least one pair of floating gate regions located on the substrate, at least one pair of selection gate electrodes located on the external side of the at least one pair of floating gate electrodes, a drain region located between the floating gate electrodes, a first doped region located between the selection gate electrode and the floating gate electrode, and, a source region located on one side of the selection gate electrode, wherein the drain region has a shallower depth than that of the first doped region with respect to a top surface of the substrate.

The first doped region may include a heavily doped region and a lightly doped region and the lightly doped region may be blocked in the drain region.

The one-time programmable non-volatile memory device may further include a well region located to surround the source region and the drain region.

A length of the floating gate electrode may be shorter than a length of the selection gate electrode.

The one-time programmable non-volatile memory device may further include a contact plug located on the source region and the drain region and wherein the contact plug is not located on the first doped region.

The one-time programmable non-volatile memory device may further include a contact plug located on the selection gate electrode, wherein the contact plug is not located on the floating gate electrode and the selection gate electrode and the floating gate electrode may be doped with a dopant of a second conductivity type.

The source region may include a heavily doped source region and a lightly doped source region and a depth of the source region may be deeper than a depth of the drain region.

The one-time programmable non-volatile memory device may further include a silicide layer located on the selection gate electrode, wherein the silicide layer is not located on the floating gate electrode.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
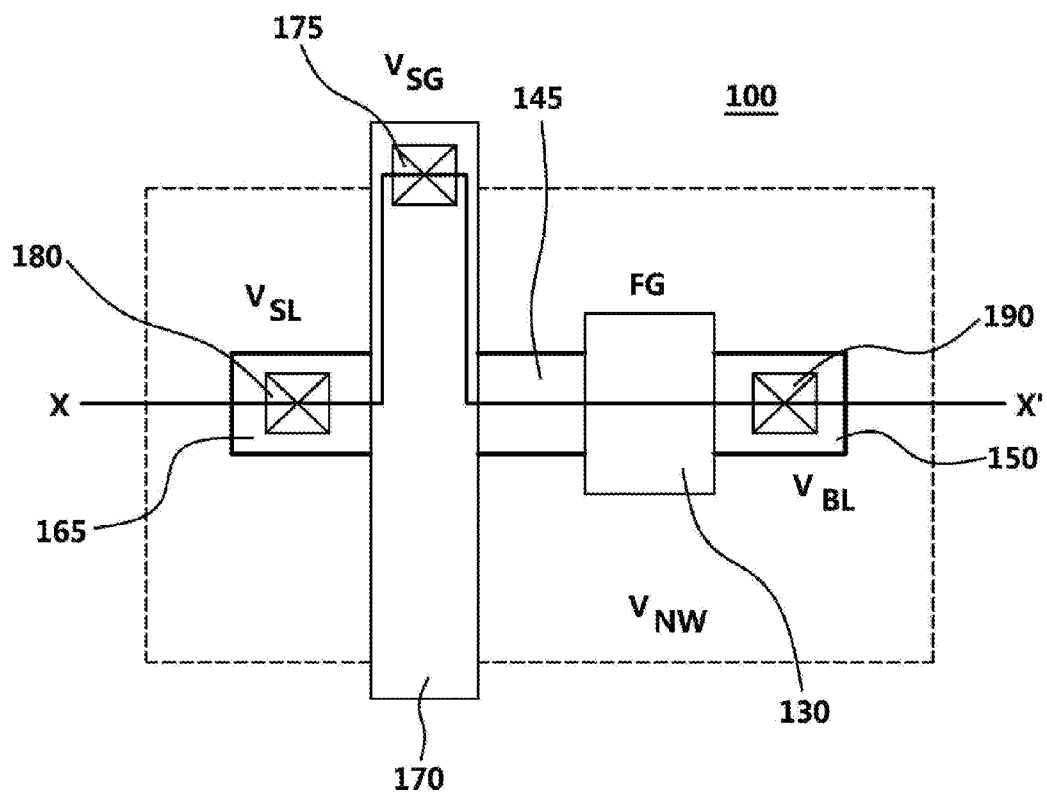
FIG. 1A illustrates a top plan view of an OTP-NVM cell structure according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art. In the following description, the same drawing reference numerals are used for the same elements, even in different drawings. The matters defined in the description, such as detailed constructions of terms and elements, are provided to assist in a comprehensive understanding of the present examples. Accordingly, it is apparent that it is possible for the examples to be carried out without those specifically defined matters. Also, well-known functions or constructions are not described in detail to avoid obscuring the examples with unnecessary detail.

While the expressions such as "first" or "second" are potentially used to refer to various elements, the elements are not intended to be limited by the expressions. Such expressions are used only for the purpose of distinguishing one element from the other when referring to such elements.

The expressions presented are used herein only for the purpose of explaining specific examples and are not intended to place limits on the present examples. An expression in singular form also encompasses plural meaning, unless otherwise specified. Throughout the description, the expression "comprise" or "have" is used only to designate the existence of a characteristic, number, step, operation, element, component or a combination thereof which is described herein, but not to preclude probability of existence of one or more of the other characteristics, numbers, steps, operations, elements, components or combinations of these or other appropriate additions.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

The present disclosure will be described more fully hereinafter with reference to the accompanying drawings, in which exemplary embodiments of the disclosure are shown.

The present disclosure discusses embodiments designed to address issues discussed with respect to the aforementioned related arts. The present disclosure aims to provide a method for fabricating an OTP-NVM device and a semiconductor device fabricated thereby. The method includes omitting the LDD process in the drain region of the OTP floating gate thereby generates high electric field near the drain region. As a result, generation of HCI is increased and credibility is improved.

According to the present disclosure, the method for fabricating an OTP semiconductor device and a semiconductor device fabricated thereby can effectively inject HC without adding a mask.

Further, PGM of the OTP-NVM cell becomes easier since HC is heavily injected and there is an effect of increasing gain when implementing read function.

Further, additional mask process is not necessary, thereby overall cost for fabrication can be decreased.

Figure 1B:
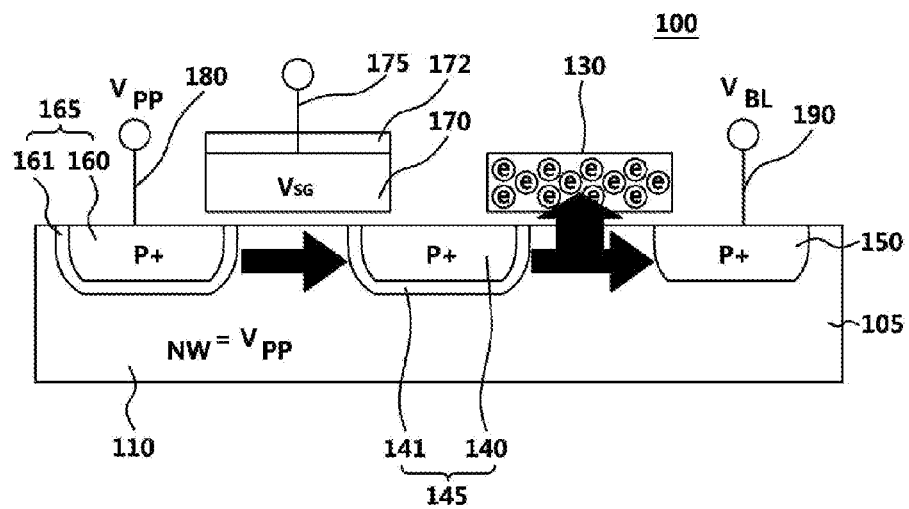
FIG. 1B illustrates a cross-sectional view of an X-X' line of an OTP-NVM cell of FIG. 1A according to an embodiment.

FIG. 1A is a layout of one OTP-NVM cell, and FIG. 1B illustrates a structure of a cross-sectional view of an OTP-NVM cell.

The OTP-NVM cell 100 includes a selection gate electrode 170 connected with a word line contact plug 175, a floating gate electrode 130 with the contact plug not formed, a source region 165 connected with a source line contact plug 180, a drain region 150 connected with a bit line contact plug 190, and a first doped region 145 located between the selection gate electrode 170 and the floating gate electrode 130. In the example of FIGS. 1A-1B, the floating gate electrode 130 means an electrode in an electrically floating state because there is no electrically connected contact plug in the floating gate electrode 130. The floating gate electrode 130 is completely surrounded by the gate insulating layer or the interlayer dielectric film and the spacer insulating layer.

The selection gate electrode 170 and the floating gate electrode 130 use a polysilicon material doped with one of As, B, and P. Here, arsenic (As) and phosphorus (P) act as electron donors while boron (B) acts as an electron acceptor. The present disclosure uses a polysilicon material doped with a dopant of P-type boron (B) or boron difluoride (BF2) and so on. The selection gate electrode and the floating gate electrode are simultaneously formed during the same process. In this example, the first doped region 145 does not include an electrically connected contact plug. For example, the first doped region 145 is potentially considered to be a drain region of the selection gate electrode 170 or a source region of the floating gate electrode 130.

FIG. 1B illustrates a cross-sectional view of an X-X' line of an OTP-NVM cell of FIG. 1A according to an embodiment.

For example, a semiconductor substrate 105 includes a first conductivity type well region 110. A channel region is located in the well region 110. Furthermore, a second conductivity type source region 165 is located in the well region 110. The second conductivity type source region 165 includes a second conductivity type heavily doped region 160 and second conductivity type lightly doped region 161. Similarly, the first doped region 145 of the second conductivity type also includes a second conductivity type heavily doped region 140 and second conductivity type lightly doped region 141. Furthermore, the first doped region 145 is also located in the well region 110.

In the example of FIG. 1B, the source region 165 and the first doped region 145 may be formed simultaneously during the same process and a P-type dopant may be ion implanted during such a process. Also, the lightly doped regions 161 and 141 are further formed deeply, so that they respectively surround the heavily doped regions 160 and 140 appropriately. Furthermore, the source line contact plug 180 is formed appropriately on the source region 165.

However, the second conductivity type drain region 150 only includes the heavily doped drain region 150 because the lightly doped regions 141, 161 are blocked. Of course, a third doped region may surround the drain region in other embodiments. Examples of this third doped region are illustrated in FIG. 2 and FIG. 3. Accordingly, a junction of the drain region 150 has a depth that is shallower than the depth of the source region or the first doped region with respect to a surface of a substrate. For example, the source region 165 or the first doped region 145 has a depth deeper than the depth of the drain region 150. Furthermore, a bit line contact plug 190 is located on the drain region 150.

As previously mentioned, the junction of the drain region 150 has a depth that is shallower than that of the source region or the first doped region. This shallower depth is provided because the drain region is blocked with a mask when implanted with lightly doped ion implantation to form a lightly doped region. Then, a lightly doped ion implanted region is not formed in the drain region. Accordingly, the drain region is in direct contact with the well region and generates rapid changes in the electric field at the boundary side at which the lightly doped well region and the heavily doped drain region contact each other.

The more the electric field rapidly changes, the higher the probability that a hot carrier is generated by the electrical field change, due to a collision between an electron and a hole occurring. Accordingly, many electrons may get in the floating gate. This phenomenon is referred to as the electrons being trapped. A channel region 220, illustrated with reference to FIG. 6B, is located between the source region 165 and the first doped region 145. Furthermore, the channel region 220 is additionally located between the first doped region 145 and the drain region 150.

The more hole carriers that move through the channel region that move near the drain region 150, the more speed increases occur due to rapid change of the electric field. As a result, many electrons are generated due to collisions with a silicon grid. In order to induce rapid changes in the electric field, a lightly doped region with the same conductivity type with the drain region is excluded from being present near the drain region.

As previously mentioned, the first doped region 145 is not connected to a word line or bit line. Accordingly, a word line contact plug 175, a bit line contact plug 190, or a source line contact plug 180 is not formed to be in contact with the first doped region 145. The selection gate electrode 170 and the floating gate electrode 130 are located in parallel so as to be level with one another on the well region 110. In the example of FIG. 1B, the word line contact plug 175 is located on the selection gate electrode 170. However, a contact plug that is electrically connected with the floating gate electrode 130 is not located here.

During program operation, the floating gate electrode 130 becomes the gate electrode 130 in which electrons are trapped due to HCI. Here, hot-carrier injection (HCI) is a phenomenon in solid-state electronics where an electron or a hole gains sufficient kinetic energy to overcome a potential barrier necessary to break an interface state. Due to high generation of the above HCl phenomenon, programming of the OTP-NVM cell becomes easier. Then, during an operation of a read function, the OTP-NVW cell is able to become an OTP-NVM cell with a high margin. Referring to the example of FIG. 1B, a silicide blocking region is formed so as to prevent forming a silicide blocking region on a top surface of the floating gate electrode 130. Such an approach is used to well store electrons charged in the floating gate. If the silicide region is formed, there may be a loss in part of the quantity of charged electrons. Thus, a silicide layer is formed on the selection gate electrode 170 to have a form as presented in the example of FIG. 1B. However, a silicide layer is not formed on the floating gate electrode 130. The floating gate electrode 130 remains as a non-silicide electrode.

According to an embodiment, a gate insulating layer is formed between each of the gate electrode and well region. Furthermore, the gate electrode, the doped region, the source region, and the drain region are all formed of a P-type conductivity type material. Thus, these elements may be deemed to form a PMOS transistor. The present disclosure is not limited to this example and may be formed appropriate as an N-type NMOS transistor.

Figure 2A:
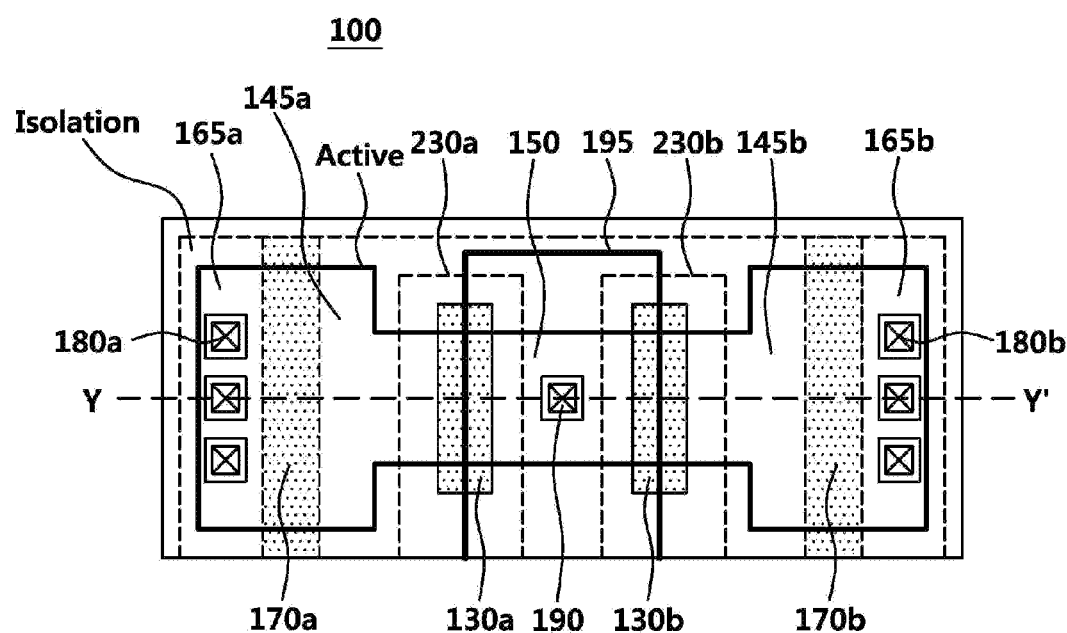
FIG. 2A illustrates a top plan view of a structure of a plurality of OTP-NVM cell formed according to another embodiment.
Figure 2B:
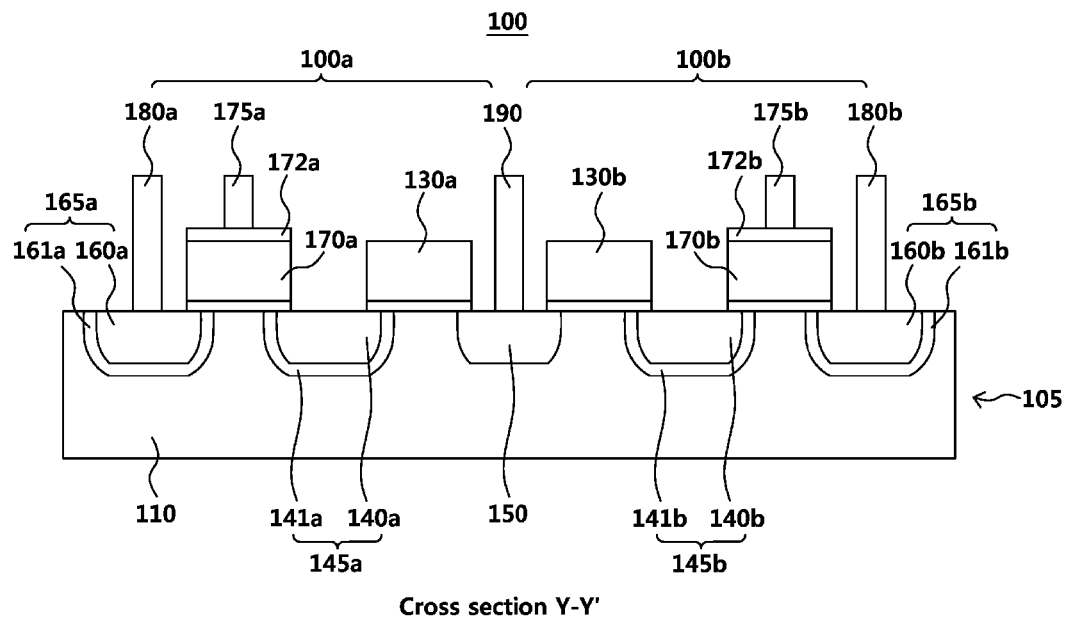
FIG. 2B illustrates a cross-sectional view of a Y-Y' line of an OTP-NVM cell of FIG. 2A according to one embodiment.
Figure 2C:
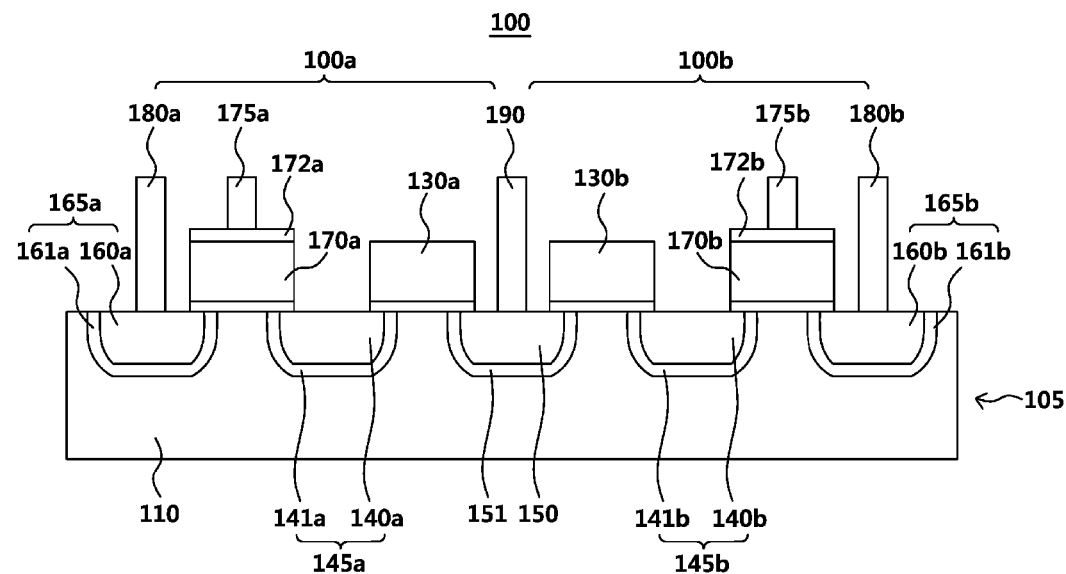
FIG. 2C illustrates a cross-sectional view of a Y-Y' line of an OTP-NVM cell of FIG. 2A according to one embodiment.

FIG. 2A illustrates a top plan view 100 of a layout of a plurality of OTP-NVM cells formed and FIG. 2B is an exemplary illustration of a cross-sectional view along a line Y-Y' of an OTP-NVM cell of FIG. 2A according to an embodiment. FIG. 2C illustrates a cross-sectional view of a Y-Y' line of an OTP-NVM cell of FIG. 2A according to an embodiment.

First, referring to the embodiments of FIG. 2A and FIG. 2B, an active region and isolation region are located in a substrate 105. Furthermore, two OTP cells 100a and 100b are located to be facing each other. For example, at least one pair of floating gate electrodes 130 including a first floating gate electrode 130a and a second floating gate electrode 130b is located in the center of the substrate.

Furthermore, a common drain region 150 is located between the one pair of floating gate electrodes 130. Additionally, the contact plug 190 connected with the bit line is located on the drain region 150.

In addition, at least one pair of selection gate electrodes 170 including a first selection gate electrode 170a and a second selection gate electrode 170b is located in the external side of the floating gate.

Furthermore, at least one source region 165 including a first source region 165a and a second source region 165b is located on one side of the selection gate electrode 170. Also, a first source line contact plug 180a and a second source line contact plug 180b that are electrically connected with respective source regions are located to be present here.

The floating gate electrode has a length that is shorter than that of the selection gate electrode in order to form an even further compact OTP-NVM cell. As illustrated in the example of FIG. 2A, in comparison with the length of the gate electrode in a vertical direction, that is, vertical to the channel direction, the floating gate electrode has a length that is shorter than that of the selection gate electrode. As a result, two OTP cell devices may be formed in a small space.

Furthermore, a first doped region 145a is located between a first selection gate electrode 170a and a first floating gate electrode 130a. A second doped region 145b is located between a second selection gate electrode 170b and a second floating gate electrode 130b. In addition, a plurality of word line contact plugs 175a and 175b are located on the selection gate electrodes 170a and 170b, respectively.

In addition, the first doped region 145a includes a heavily doped region 140a and a lightly doped region 141a. Furthermore, the second doped region 145b also includes a heavily doped region 140b and a lightly doped region 141b.

In this example, a blocking mask 195 is present that prevents the common drain region 150 from being lightly doped. Due to the presence of the light doping blocking mask 195, the blocking mask 195 prevents the formation of lightly doped regions 141a and 141b having the same conductivity type as the drain region 150 on the heavily doped drain region. Accordingly, as previously mentioned, a high electric field may be obtained near the drain region 150. As a result, as illustrated in FIG. 2B, the depth of the common drain region 150 from a top surface of the substrate is shallower than the depth of the first or the second doped region 145a or 145b. Such a relative depth is because lightly doped regions 141a and 141b are formed on the first and second doped regions 145a and 145b in addition to the heavily doped regions 140a and 140b. Such a difference is generated in accordance with the depth of the lightly doped regions 141a and 141b. In this example, the heavily doped drain region 150 and the heavily doped regions 140a and 140b are formed in the same process.

The first and second source regions 165a and 165b are also formed, as illustrated above. In this example, the first source region 165a includes the heavily doped source region 160a and the lightly doped source region 161a. Furthermore, the second source region 165b also includes the heavily doped source region 160b and the lightly doped region 161b. In such an example, the common drain region 150 has a depth shallower than that of the first and second source regions 165a and 165b. Also, the differences of the depths between the drain region and the first and second source regions 165a and 165b are generated according to the differences of depths of the lightly doped source regions 161a and 161b. Also, the first and second source regions 165a and 165b are formed in the heavily doped source regions 160a and 160b with the lightly doped source regions 161a and 161b formed as well.

Furthermore, referring to the embodiment of FIG. 2B, silicide layers 172a and 172b are formed on the selection gate electrodes 170a and 170b. However, a silicide layer is not formed on the surface of the floating gate electrodes 130a and 130b. Instead, silicide blocking layers 230a and 230b are formed on the surface of the floating gate electrodes 130a and 130b. An insulating layer, such as a silicon oxide layer or silicon nitride layer, is formed as the silicide blocking layers 230a and 230b. For example, the silicide layer is not formed on the surface of the floating gate electrodes 130a and 130b, which causes an effect to store electrons charged in the floating gate electrodes 130a and 130b well. When the silicide is formed, there may be a loss in a part of the charged electrons. Accordingly, the silicide is formed in the selection gate electrodes. However, the silicide layer is not formed on the floating gate electrode. As a result, the floating gate electrodes 130a, 130b are remained as having a non-silicide surface.

FIG. 2C illustrates a cross-sectional view of a Y-Y' line of an OTP-NVM cell of FIG. 2A according to another embodiment. FIG. 2C differs from FIG. 2B in that the third doped region 151 is added onto the common drain region 150. The third doped region 151 is a region that is doped with a dopant having a polarity opposite from that of a common drain region. For example, when the drain region is type P, the third doped region 151 is an N-type drain region. The N-type well region that is formed in the substrate has the same conductivity type as the third doped region 151. Thus, an N-type doped region 151 having a higher concentration than that of the N-type well region is formed near the common drain region. Accordingly, a further rapid electric field change than that is illustrated in the example of FIG. 2B is formed. Such a rapid electric field change phenomenon occurs because a heavily doped N-type doped region 151 is in contact with a heavily doped drain region 150. As further illustrated in the example of FIG. 7, when a third doped region having a conductivity type opposite to that of the drain region is added, an Isub or substrate leakage current of Only HNM(1) is generated to be higher than a corresponding current for skip(4) that does not have the third doped region. Because HC is heavily injected as previously illustrated, programming of a OTP-NVM cell becomes easier. Subsequently, when implementing a read function, it may be an OTP-NVM cell with a high margin.

Subsequently, FIGS. 3 and 4 illustrate an embodiment of various OTP-NVM cells, illustrating aspects of a first, second or third doped region with respect to a floating gate electrode. The OTP-NVM cell is formed using a process which forms a CMOS device. Various implantation processes used when manufacturing the CMOS device may be applied to manufacturing the OTP-NVM cell. Subsequently, HPM refers to a P-type lightly doped region P-LDD in a high voltage PMOS device, and HNM refers to an N-type lightly doped region N-LDD in a high voltage NMOS device.

For example, NM refers to an N-type lightly doped region N-LDD in a low voltage NMOS device. Furthermore, PM refers to a P-type lightly doped region P-LDD in a low voltage PMOS device. A depth of such an HPM region and such an HNM that are used in a high voltage device is deeper than that of an NM region and a PM region. For example, the P-halo is a doped region that is ion-injected with an N-type dopant in order to prevent diffusion of heavily doped drain region to an inappropriate other region.

According to the present disclosure, a lightly doped region located near the drain region is referred to as a third doped region for convenience. By contrast, according to the present disclosure, a first or second doped region is referred to as a doped region that is located between a selection gate electrode and a floating gate electrode.

Figure 3A:
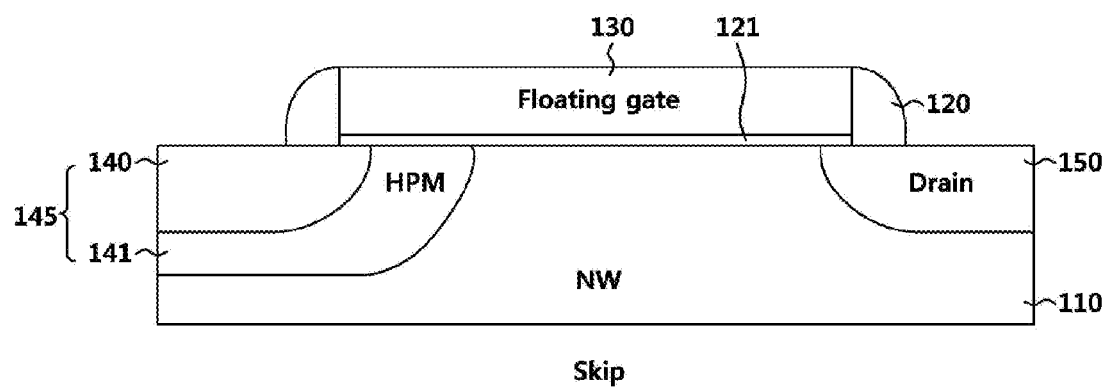
FIGS. 3A, 3B and 3C illustrate a cross-sectional view of a semiconductor device according to an embodiment.

FIG. 3A illustrates a structure referred to as a "skip" that illustrates a cross-sectional view of an OTP-NVM semiconductor device according to an embodiment. As illustrated in the example of FIG. 3A, the OTP-NVM semiconductor device 100 includes an N-type well region 110, a heavily doped region 140 located on an upper part of one side of N well region 110 with respect to the cross-section, and the first doped region 145 including the lightly doped region HPM 141 located in a lower part of the heavily doped region 140. Furthermore, the OTP-NVM semiconductor device 100 includes the drain region 150 located on an upper part of the other side of the N-type well region 110. However, the formation of the lightly doped region HPM is excluded under the drain region. Furthermore, the OTP-NVM semiconductor device 100 may include an electrically floated floating gate 130 that is located on the upper part of the N-type well region NW 110, a gate insulating layer 121 located between the floating gate 130 and the N-type well region 110, and a spacer 120 located on the side wall of the floating gate 130. Thus, the example of FIG. 3A has a similar structure with the previously mentioned structure of FIG. 1B or FIG. 2B.

Figure 3B:
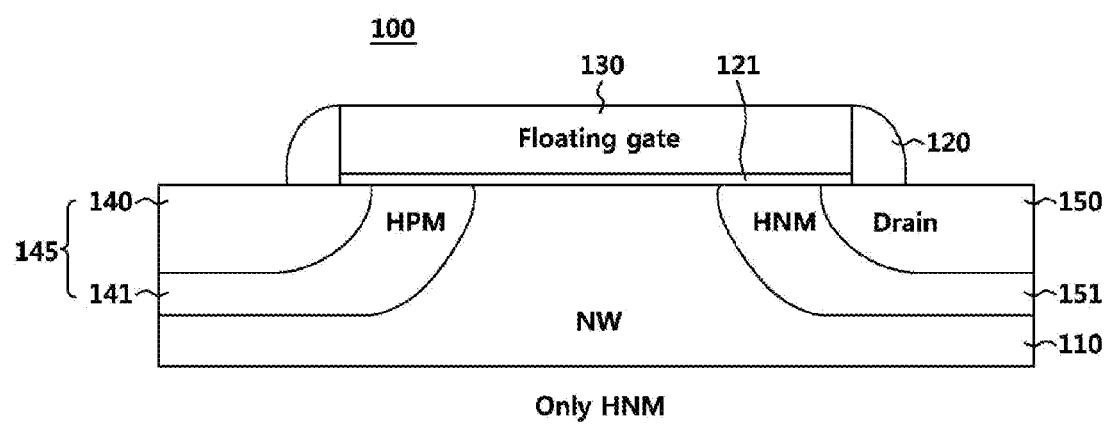

However, the figure of FIG. 3B illustrates a structure referred to as an "Only HNM" structure, which includes an N-type lightly doped region HNM 151 formed under the P-type drain region 150. Thus, the figure of FIG. 3B has a similar structure with the previously mentioned FIG. 2C.

Figure 3C:
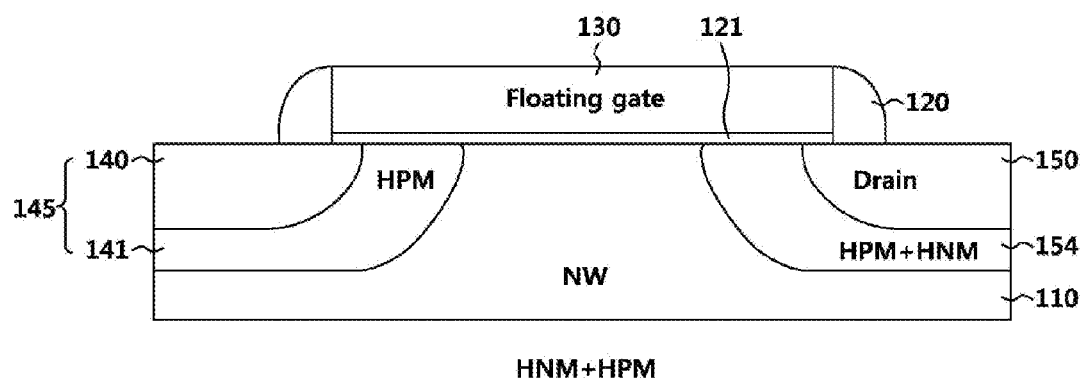

FIG. 3C illustrates an "HPM+HNM" that is an OTP-NVM cell structure that has a lightly doped region HPM+HNM 154 that is simultaneously lightly doped with type P dopants and type N dopants near the drain region 150. FIG. 3C adds HPM accordingly, which is advantageous for read operation.

Figure 4A:
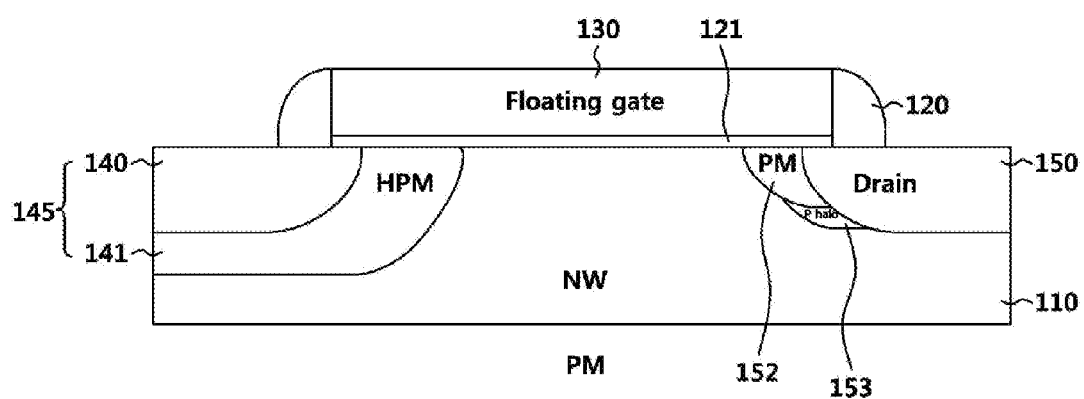
FIGS. 4A, 4B and 4C illustrate a cross-sectional view of a semiconductor device according to an embodiment.
Figure 4B:
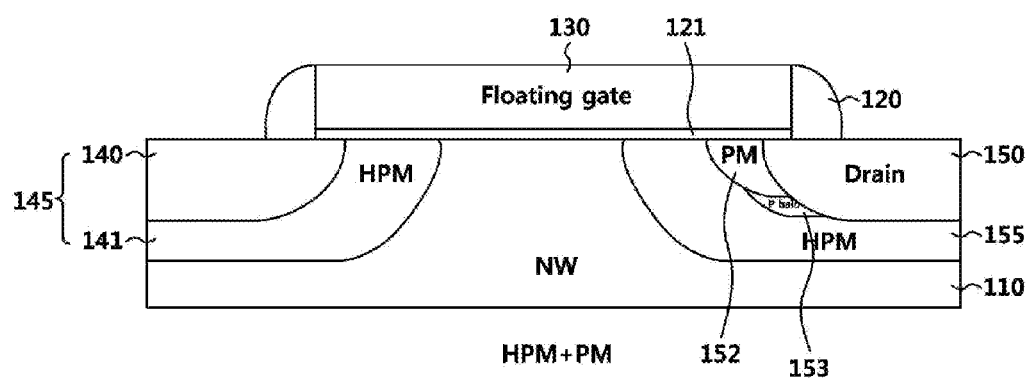
Figure 4C:
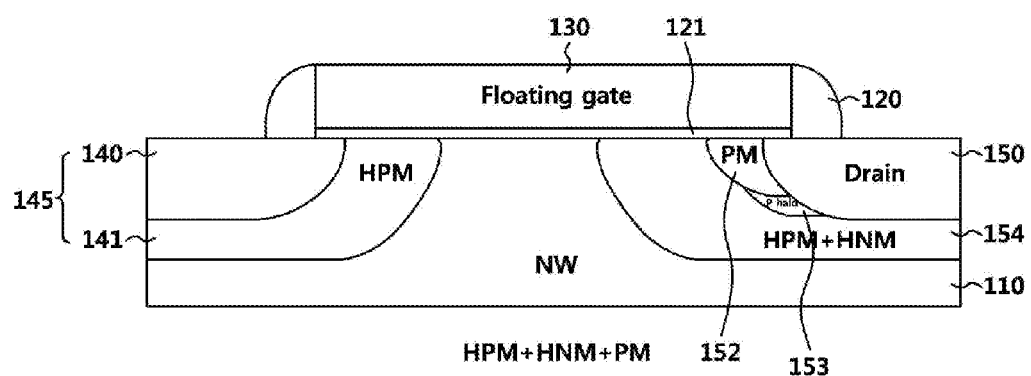

FIGS. 4A, 4B, and 4C illustrate an OTP cell structure having a P-type drain region added with the P-type lightly doped region PM and the N-type lightly doped region P-halo. For example, FIG. 4A illustrates a structure referred to as "PM". In this example, FIG. 4A illustrates a structure, such that the P-type lightly doped region PM 152 and the N-type lightly doped region P-halo 153 are simultaneously formed near the drain region 150.

Alternatively put, an N-type lightly doped region P-halo 153 is formed in the lower part of the P-type lightly doped region PM 152. Accordingly, the P-type lightly doped region PM 152 and the N-type lightly doped region P-halo 153 have a depth that is even shallower than that of the first doped region 145.

The P-type lightly doped region PM is located near the substrate surface. As a result, there is an effect of further increasing concentration of the P-type drain region. However, the N-type lightly doped region P-halo is located to be spaced apart from the substrate surface. As a result, there is an effect of increasing the concentration of the N-type well region 110. Accordingly, the concentration of the P-type dopant increases near the surface of the semiconductor surface and the N-type concentration increases in the region that is separated from the substrate surface.

Figure 7:
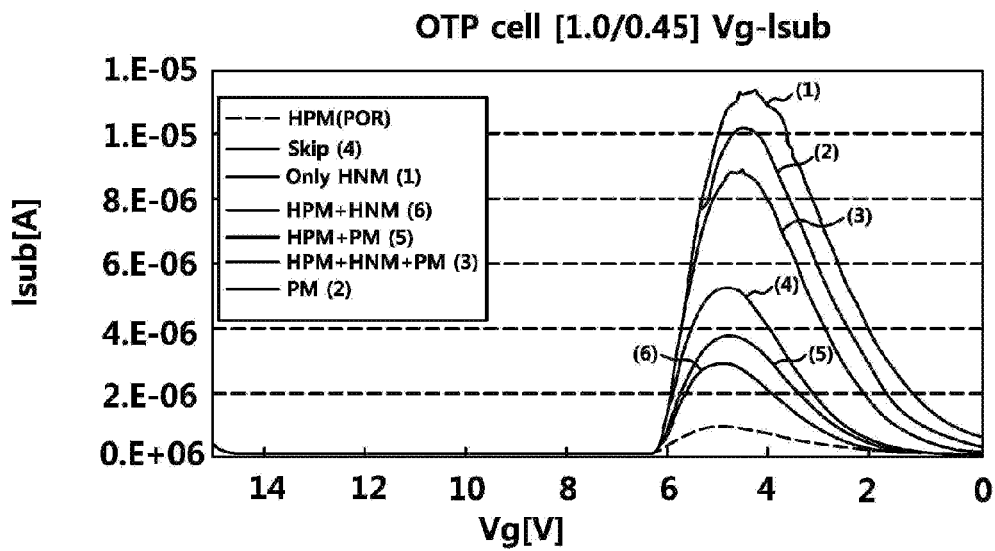
FIG. 7 illustrates a diagram comparing amounts of current applied to a substrate with respect to gate voltages according to various embodiments.

Thus, HCl is actively generated according to the operations discussed further, above. Furthermore, programming the OTP-NVM cell becomes easier. Subsequently, when implementing a read function, the OTP-NVM cell may be an OTP-NVM cell with a higher margin. As illustrated in the example of FIG. 7, the structure of FIG. 4A, i.e. "PM," has a very high relative Isub value.

FIG. 4B is a structure referred to as a "HPM+PM" structure. Such a structure is an OTP-NVM cell structure with a P-type lightly doped region HPM that surrounds the P-type lightly doped region PM 152 and the N-type lightly doped region P-halo 153, which are added to the drain region 150. There is also an effect of the concentration of the P-type dopant further increasing near the drain region. However, as a lightly doped region having the same conductivity type as the drain region is formed on the drain region, the Isub value is smaller than that of the structure of FIG. 4A.

FIG. 4C is a structure referred to as a "HPM+HNM+PM" structure. The structure of FIG. 4C is an OTP-NVM cell structure formed with a lightly doped region HPM+HNM 154 that is simultaneously lightly doped of N-type and P-type dopants instead of a P-type lightly doped region HPM.

Figure 5A:
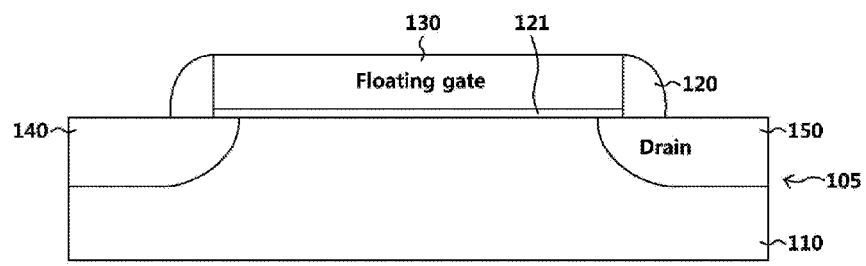
FIGS. 5A, 5B and 5C illustrate a diagram illustrating a method for fabricating a semiconductor device.
Figure 5B:
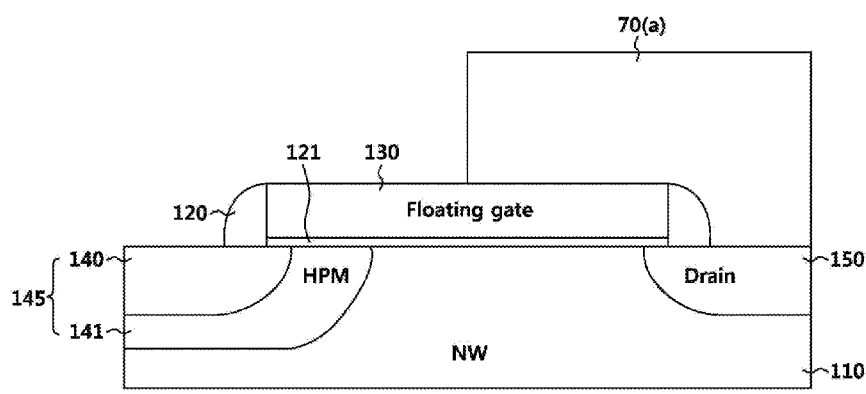
Figure 5C:
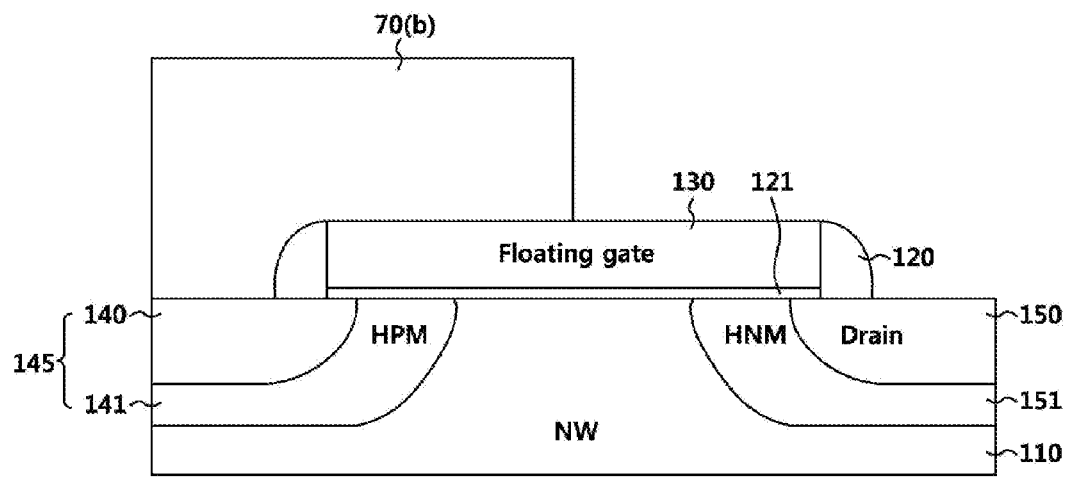

FIGS. 5A through 5C illustrate a method for fabricating a semiconductor device according to an embodiment. As illustrated in the example of FIG. 5A, a floating gate 130 is formed on the N-type well region 110. Then, a spacer 120 is formed on the side wall of the floating gate 130. Furthermore, the heavily doped region 140 and the heavily doped drain region 150 are simultaneously formed on the N-well region 110 that is in contact with the opposite terminals of the floating gate 130. When the heavily doped region 140 and the heavily doped drain region 150 are simultaneously formed, they are formed using the same ion implantation energy and the same dose amount of dopant. As a result, both of the heavily doped region 140 and the heavily doped drain region 150 have the same depth and concentration.

Furthermore, as illustrated in the example of FIG. 5B, a first PR mask layer 70(a) is formed on a part of the floating gate 130 and on a front side of the drain region 150. Due to the first mask layer 70(a), when the lightly doped region HPM 141 is formed, the drain region 150 is blocked of ion implantation by the PR mask layer. However, there is no PR mask layer 70(a) located in the source region 140. As a result, a lightly doped dopant is ion implanted and thereby forms the lightly doped region HPM 141. The first PR mask layer 70(a) becomes a mask, like the blocking mask 195 which is previously mentioned in FIG. 2A.

In such an example, in order to form the lightly doped region HPM 141, the lightly doped region HPM 141 is ion implanted with a tilt-rotation scheme that is further deeper than the heavily doped region. Accordingly, the lightly doped region 141 surrounds the heavily doped region 140. A structure that includes the lightly doped region 141 and the heavily doped region 140 that are formed as previously mentioned is the first doped region 145. Furthermore, the PR mask layer is removed as well.

Next, FIG. 5C illustrates an optional process. The optional process may be implemented when a special ion implantation process is implemented with respect to the drain region. In this example, the part of the floating gate 130 and the second PR mask layer 70(b) are formed on the front side of the source region 140. When a lightly doped region HNM 151 is formed due to using the second PR mask layer 70(b), ion implantation is blocked in the source region 140. Furthermore, a dopant is implanted only in the drain region 150, and accordingly the lightly doped region HNM 151 that surrounds the drain region is formed. Furthermore, the PR mask layer is removed.

Furthermore, the semiconductor device is heat processed at a high temperature for dopant diffusion. Also, a non-sal process may be implemented to prevent the formation of silicide layer on the floating gate electrode. For example, in the non-sal process, first the insulating layer is deposited, and then the process causes removal of all of the insulating layers in the regions where a silicide layer would be formed. Furthermore, a cobalt (Co), nickel (Ni) or titanium (Ti) metal layer is deposited. Accordingly, the silicide process is implemented. Furthermore, as previously mentioned, the silicide layer is formed on the selection gate electrode, but the silicide layer is not formed on the floating gate electrode.

Figure 6A:
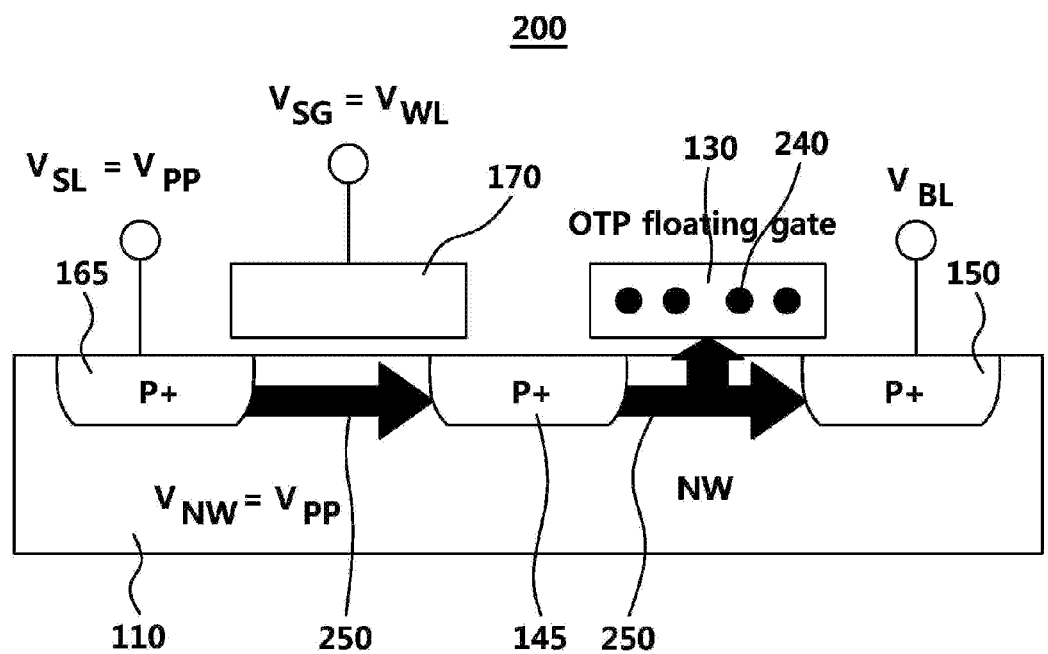
FIG. 6A illustrates a diagram of a program operation that charges electrons in a floating gate of an OTP-NVM cell according to an embodiment.
Figure 6B:
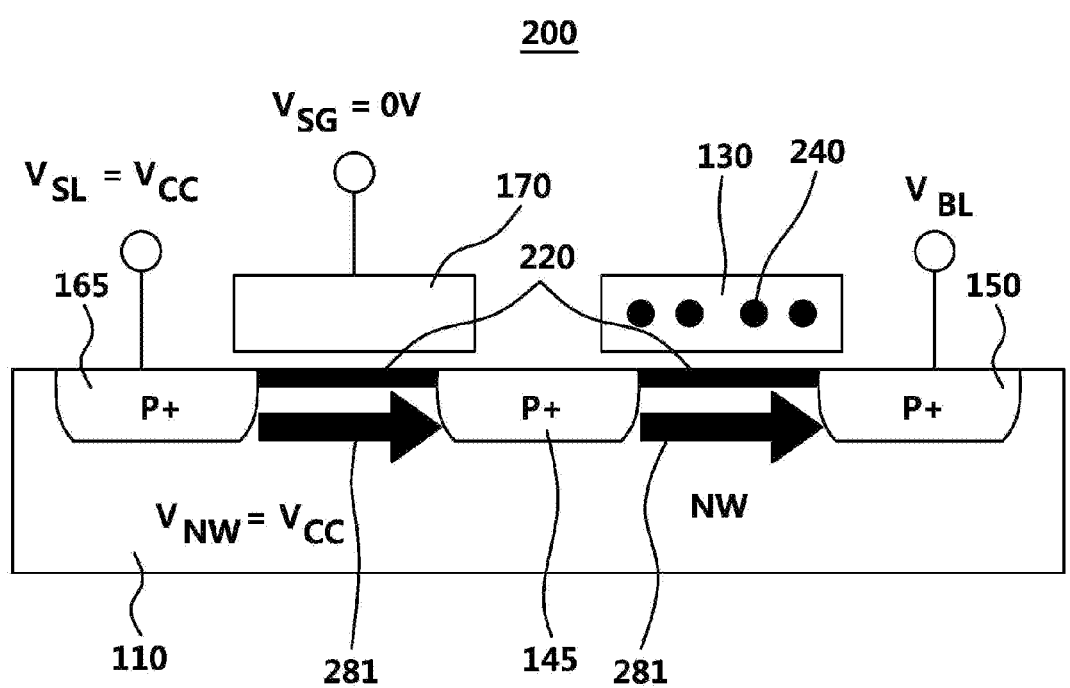
FIG. 6B illustrates a diagram of a read operation in a state in which electrons are charged in a floating gate of the OTP-NVM cell according to an embodiment.
Figure 6C:
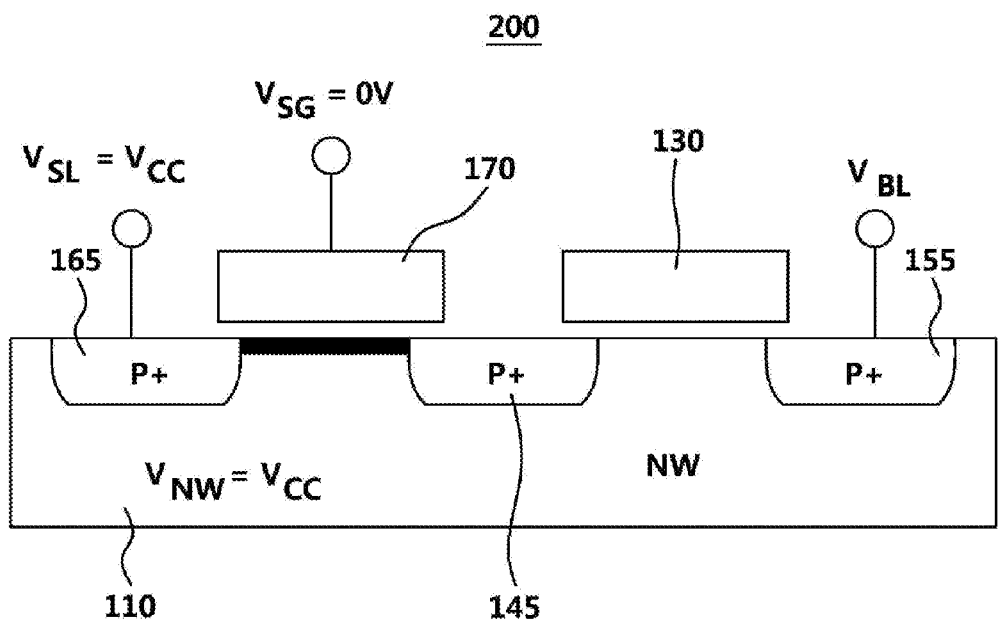
FIG. 6C illustrates a diagram of a read operation on a floating gate in which electrons are not charged in the OTP-NVM cell, according to an embodiment.

FIG. 6A illustrates a diagram of a programming operation that charges electrons 240 in the floating gate 130 of the OTP-NVM cell 200 according to an embodiment. The arrow 250 denotes electron movement through channel region. FIG. 6B illustrates a diagram of a read operation in a state that electrons 240 are charged in a floating gate 130 of the OTP-NVM cell 200. The arrow 281 denotes electron movement through channel region 220. FIG. 6C illustrates a diagram of a read operation on a floating gate 130 with electrons that are not charged in the OTP-NVM cell 200 according to an embodiment.

FIG. 7 illustrates a diagram comparing an amount of current applied towards a substrate with respect to a gate voltage according to various embodiments. Since the quantity of electrons which are trapped in the floating gate cannot be directly measured, the current applied to the substrate is monitored instead. Electron-hole pairs (EHP) are generated near the drain region due to the presence of a high electric field. In this example, part of the generated hole carriers move to the substrate and part of the electrons move to the floating gate electrode. Accordingly, it is to be understood that as the current Isub applied to the substrate becomes greater, the quantity of electrons that are trapped in the floating gate increases proportionately.

As illustrated in the example of FIG. 7, the structures suggested in the present disclosure show higher amounts of current than that of related arts, "POR." That is, a larger amount of current applied to the substrate causes multiple generations of electron-hole pair (EHP) proportionately. As a result, the structure suggested in the present disclosure helps cause active generation of HCI. Further programming the OTP-NVM cell becomes easier and afterwards, when implementing a read function, it shows that it can be an OTP-NVM cell with a relatively high margin.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A one-time programmable non-volatile memory device, comprising:
    a first conductivity type well region located in a semiconductor substrate;
    a selection gate electrode and a floating gate electrode located on the substrate;
    a first doped region located between the selection gate electrode and the floating gate electrode, the first doped region overlapping with the floating gate electrode and the selection gate electrode;
    a second conductivity type source region located on one side of the selection gate electrode; and
    a second conductivity type drain region located on one side of the floating gate electrode, wherein
    a depth of the drain region has a shallower depth than that of the first doped region with respect to a top surface of the substrate.

2. The one-time programmable non-volatile memory device of claim 1, further comprising a contact plug located on the source and drain regions, and wherein the contact plug is not located on the first doped region.

3. The one-time programmable non-volatile memory device of claim 1, wherein the first doped region comprises a heavily doped region and a lightly doped region, and the drain region comprises a lightly doped region that is blocked.

4. The one-time programmable non-volatile memory device of claim 1, further comprising a third doped region located between the drain region and the well region, wherein the third doped region completely surrounds the drain region, and has an opposite conductivity type from the drain region.

5. The one-time programmable non-volatile memory device of claim 1, further comprising a third doped region located between the drain region and the well region, wherein the third doped region has a shallower depth than that of the first doped region, and has a same conductivity type as the drain region.

6. The one-time programmable non-volatile memory device of claim 1, further comprising a third doped region formed between the drain region and the well region, wherein the third doped region completely surrounds the drain region, and has a lower dopant concentration than the drain region.

7. The one-time programmable non-volatile memory device of claim 1, further comprising a contact plug located on the selection gate electrode, wherein the contact plug is not located on the floating gate electrode, and the selection gate electrode and the floating gate electrode are doped with a dopant of the second conductivity type.

8. The one-time programmable non-volatile memory device of claim 7, wherein the contact plug is a word line contact plug, a bit line contact plug, or a source line contact plug.

9. The one-time programmable non-volatile memory device of claim 1, wherein the source region comprises a heavily doped region and a lightly doped region, and a depth of the source region is deeper than a depth of the drain region.

10. The one-time programmable non-volatile memory device of claim 1, further comprising a silicide layer located on the selection gate electrode, wherein a silicide blocking layer is located on the floating gate electrode.

11. The one-time programmable non-volatile memory device of claim 10, wherein the silicide blocking layer is a silicon oxide layer or a silicon nitride layer.

12. A one-time programmable non-volatile memory device comprising:
a semiconductor substrate comprising an active region and an isolation region;
at least one pair of floating gate regions located on the substrate;
at least one pair of selection gate electrodes located on the external side of the at least one pair of floating gate electrodes;
a drain region located between the floating gate electrodes;
a first doped region located between the selection gate electrode and the floating gate electrode;
a source region located on one side of the selection gate electrode; and
a well region located to surround the source region and the drain region, wherein
the drain region has a shallower depth than that of the first doped region with respect to a top surface of the substrate.

13. The one-time programmable non-volatile memory device of claim 12, wherein the first doped region comprises a heavily doped region and a lightly doped region and the lightly doped region is blocked in the drain region.

14. The one-time programmable non-volatile memory device of claim 12, wherein a length of the floating gate electrode is shorter than a length of the selection gate electrode.

15. The one-time programmable non-volatile memory device of claim 12, further comprising a contact plug located on the source region and the drain region and wherein the contact plug is not located on the first doped region.

16. The one-time programmable non-volatile memory device of claim 12, further comprising a contact plug located on the selection gate electrode, wherein the contact plug is not located on the floating gate electrode, and the selection gate electrode and the floating gate electrode are doped with a dopant of a second conductivity type.

17. The one-time programmable non-volatile memory device of claim 12, wherein the source region comprises a heavily doped source region and a lightly doped source region and a depth of the source region is deeper than a depth of the drain region.

18. The one-time programmable non-volatile memory device of claim 12, further comprising a silicide layer located on the selection gate electrode, wherein the silicide layer is not located on the floating gate electrode.

* * * * *